(12) United States Patent
Hurtz et al.

(10) Patent No.: US 6,515,330 B1
(45) Date of Patent: Feb. 4, 2003

(54) POWER DEVICE HAVING VERTICAL CURRENT PATH WITH ENHANCED PINCH-OFF FOR CURRENT LIMITING

(75) Inventors: Gary M. Hurtz, Pleasanton, CA (US); Vladimir Rodov, Redondo Beach, CA (US); Geeng-Chuan Chern, Cupertino, CA (US); Paul Chang, Saratoga, CA (US); Ching-Lang Chiang, Saratoga, CA (US)

(73) Assignee: APD Semiconductor, Inc., San Jose, CA (US)

( * ) Notice: Subject to any disclaimer, the term of this patent is extended or adjusted under 35 U.S.C. 154(b) by 0 days.

(21) Appl. No.: 10/037,495

(22) Filed: Jan. 2, 2002

(51) Int. Cl.⁷ .............................................. H01L 29/76
(52) U.S. Cl. ...................................... 257/328; 257/341
(58) Field of Search .................................. 257/328, 341

(56) References Cited

U.S. PATENT DOCUMENTS

| | | | |
|---|---|---|---|
| 3,603,811 A | 9/1971 | Day | |
| 4,982,260 A | 1/1991 | Chang et al. | |
| 5,072,276 A | * 12/1991 | Malhi et al. | 257/328 |
| 5,398,442 A | * 3/1995 | Musket | 229/120.09 |
| 5,430,315 A | 7/1995 | Rumennik | |
| 5,629,536 A | 5/1997 | Heminger et al. | |
| 5,747,841 A | 5/1998 | Ludikhuize | |
| 5,751,025 A | 5/1998 | Heminger et al. | |
| 5,798,550 A | * 8/1998 | Kuroyanagi et al. | 257/341 |
| 5,818,084 A | 10/1998 | Williams et al. | |
| 5,825,079 A | 10/1998 | Metzler et al. | |
| 5,877,515 A | * 3/1999 | Ajit | 257/154 |
| 5,956,582 A | 9/1999 | Ayela et al. | |
| 6,034,385 A | 3/2000 | Stephani et al. | |
| 6,097,046 A | 8/2000 | Plumton | |
| 6,140,678 A | * 10/2000 | Grabowski et al. | 257/328 |
| 6,186,408 B1 | 2/2001 | Rodov et al. | |
| 6,222,201 B1 | * 4/2001 | Liu et al. | 257/328 |
| 6,239,465 B1 | * 5/2001 | Nakagawa | 257/314 |

OTHER PUBLICATIONS

Christiansen, Bob, "Synchronous Rectification Improves with Age," PCIM, Aug., 1998, 6 pp.

* cited by examiner

Primary Examiner—Olik Chaudhuri
Assistant Examiner—William C. Vesperman
(74) Attorney, Agent, or Firm—Townsend and Townsend and Crew LLP; Henry K. Woodward

(57) ABSTRACT

A semiconductor current limiting device is provided by a two-terminal vertical N(P)-channel MOSFET device having the gate, body, and source terminals tied together as the anode and the drain terminal as the cathode. The doping profile of the body is so tailored with ion implantation that a depletion region pinches off to limit current. The body comprises a shallow implant to form a MOS channel and an additional deep implant through a spacer shielding the channel area. Implanted a higher energies and at an acute angle, the deep implant protrudes into the regular current path of the vertical MOSFET.

17 Claims, 23 Drawing Sheets

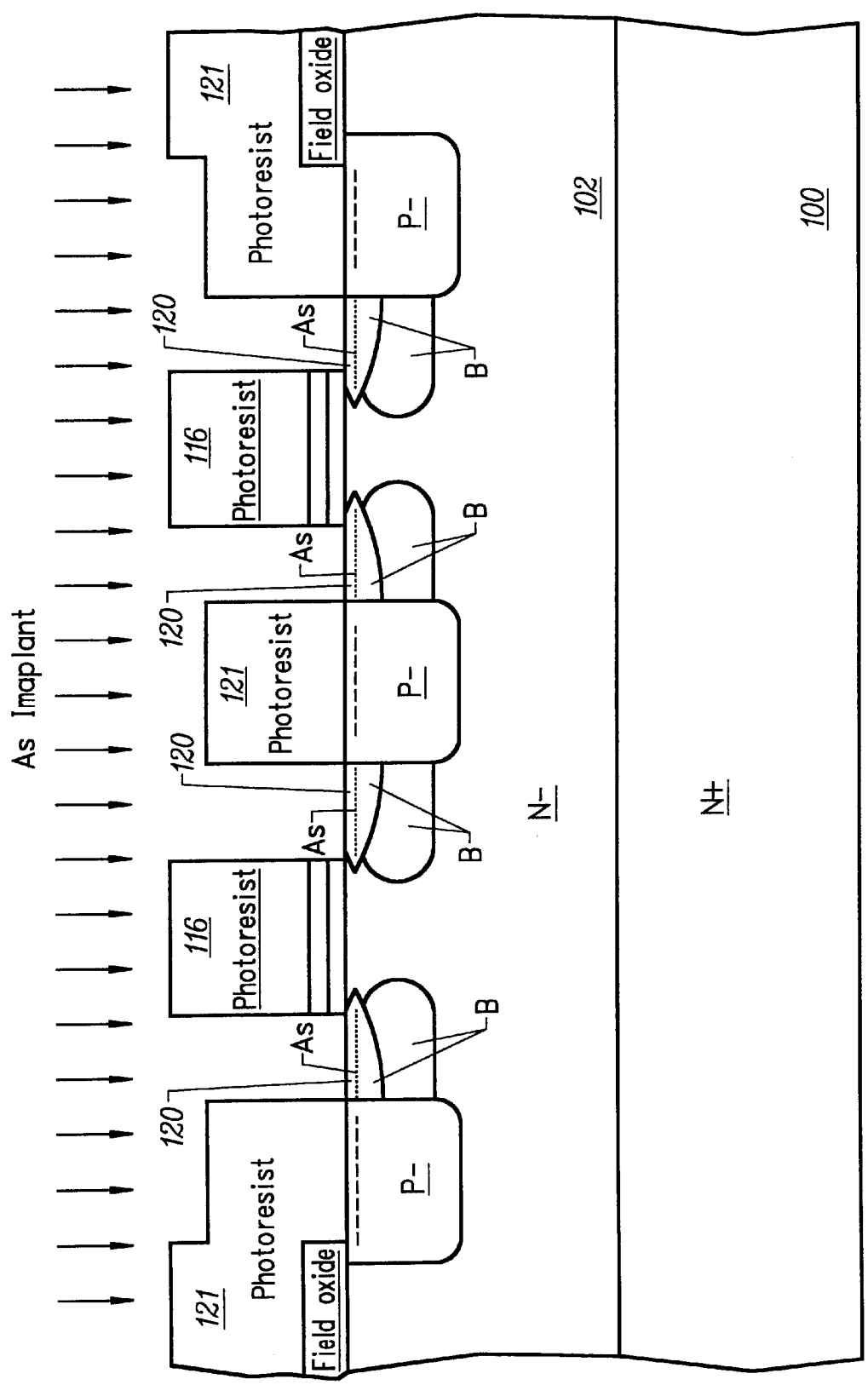

POWER DEVICE HAVING VERTICAL CURRENT PATH WITH ENHANCED PINCH-OFF FOR CURRENT LIMITING

CROSS-REFERENCES TO RELATED APPLICATIONS

NOT APPLICABLE

BACKGROUND OF THE INVENTION

This invention relates generally to power semiconductor devices, and more particularly the invention relates to a power semiconductor current limiting device and a method of making same.

It is known to protect electrical circuits against high input currents by means of a current limiter. A current limiting device works in series with an electrical circuit, contributing a low serial resistance, $R_{on}$, below a given specification. When the circuit is overloaded or malfunctioning, such as output short circuit, resulting in a high current mode outside of normal operation, the current limiting device serves to clamp the current flowing through the circuit, $I_{lim}$, within a given allowance, $\Delta I_{lim}$, until the voltage across the current limiting device exceeds its specified operating limit, $V_{br}$. When made by the method taught in the present application, the device provides low $R_{on}$, high $I_{lim}$, low $\Delta I_{lim}$, and high $V_{br}$ with a wide range of desired $I_{lim}$ that is easy to adjust by controlling certain implant energy or dose. FIG. 1 shows these critical parameters in graphical form.

The present invention is directed to a current limiting device having improved current-voltage characteristics including a lower $R_{on}$, higher $I_{lim}$, lower $\pm\Delta I_{lim}$, and higher $V_{br}$.

BRIEF SUMMARY OF THE INVENTION

In accordance with the invention, a vertical MOS current limiting device has a modified dopant implant. More particularly, in one embodiment serial resistance, $R_{on}$, can be controlled by a shallow P dopant implant and the current limit, $I_{lim}$, can be controlled by a deeper P-dopant implant. The current limiting function is achieved by the overlap of depletion regions by biasing the P-dopant implanted regions.

The invention and objects and features thereof will be more readily apparent from the following detailed description and appended claims when taken with the drawings.

DETAILED DESCRIPTION OF THE INVENTION

In accordance with the invention, a vertical MOS current limiting structure has a modified P-dopant implant to control forward limiting current. Specifically, the serial resistance $R_{on}$ can be controlled by a shallow P-dopant implant, and the current limits, $I_{lim}$, can be controlled by a deep P-dopant implant with a dopant profile minimizing the current limit allowance, $\Delta I_{lim}$.

Figure 1:
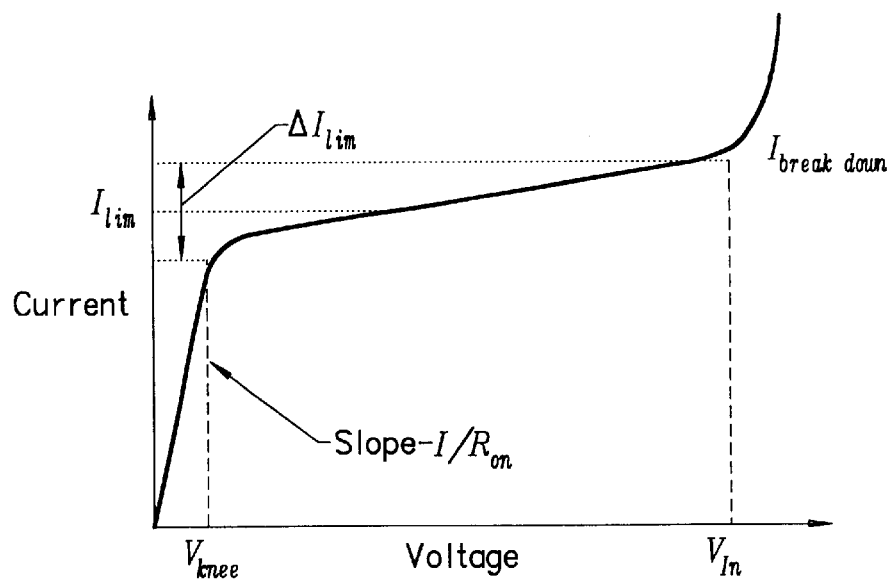
FIG. 1 is a graph illustrating current—voltage characteristics of a current limiting device.
Figure 2:
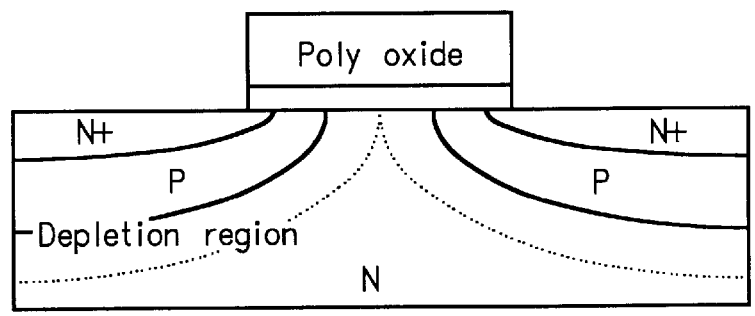
FIG. 2 is a section view illustrating a conventional double-diffused MOSFET (DMOSFET) that can be used as power MOSFET.

FIG. 2 is a section view illustrating the doping profile of a standard DMOSFET. Note that the P-type doping profile is formed through a first diffusion, and the separation of the P-region increases monotonically below the device surface. Hence, the channel requires higher voltage to pinch. Further, the current pinch is softer and results in higher allowance for current limit.

Figure 3:
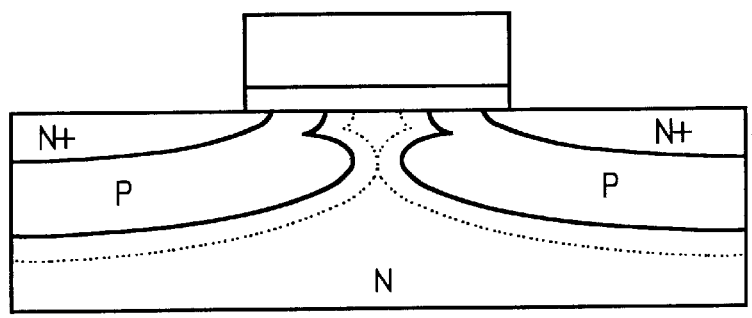
FIG. 3 is a section view illustrating a triple-diffused current limiting device in accordance with the invention.

FIG. 3 is a section view of a MOS current limiting device in accordance with the invention illustrating the unique P-dopant profile created by a double P-dopant (e.g. boron) implantation at different dose, energy and/or angle of implantation. The pinching of the conduction channel is achieved at a lower voltage, and the pinching is harder, thus resulting in a superior current limiter.

Figure 4:
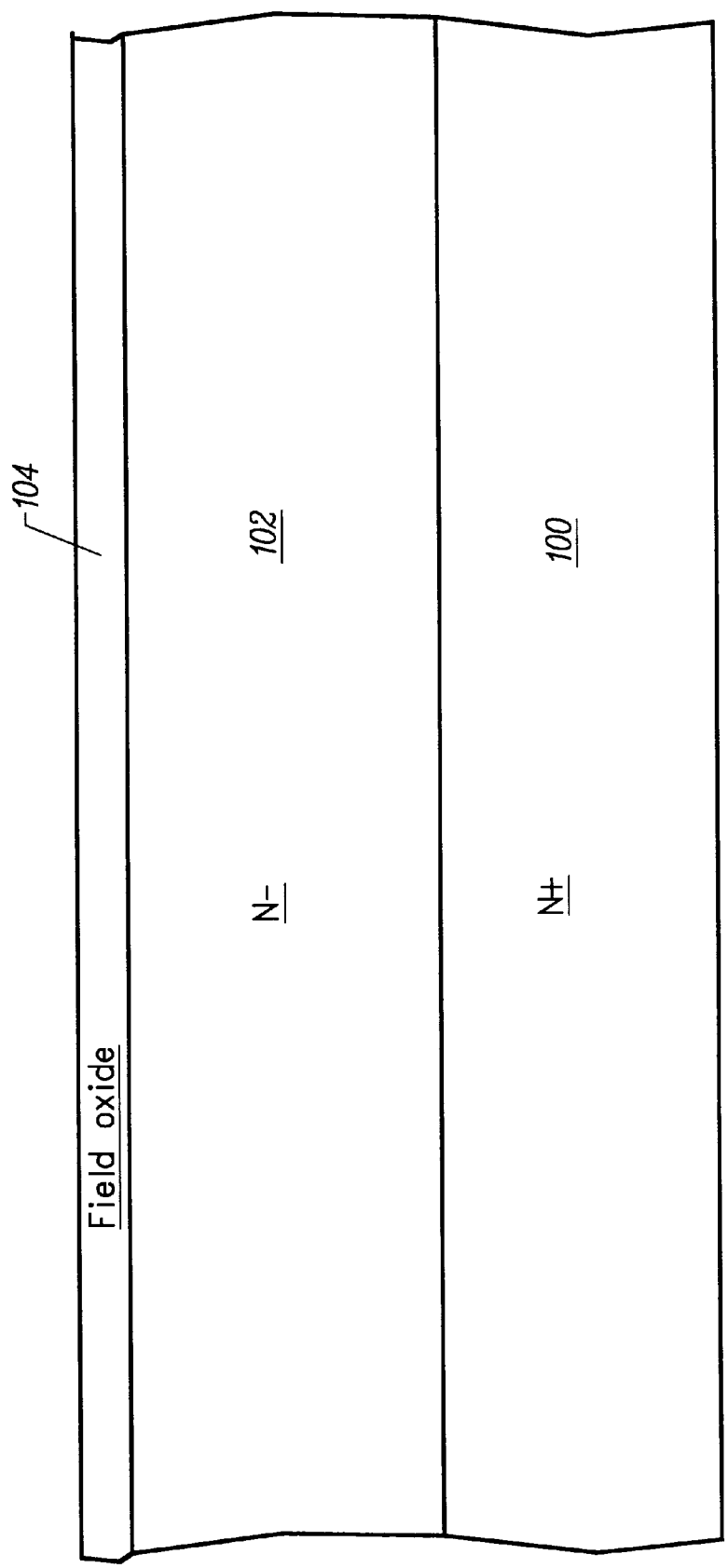
FIGS. 4–17 are section views illustrating steps in fabricating a current limiting device in accordance with embodiments of the invention.
Figure 5:
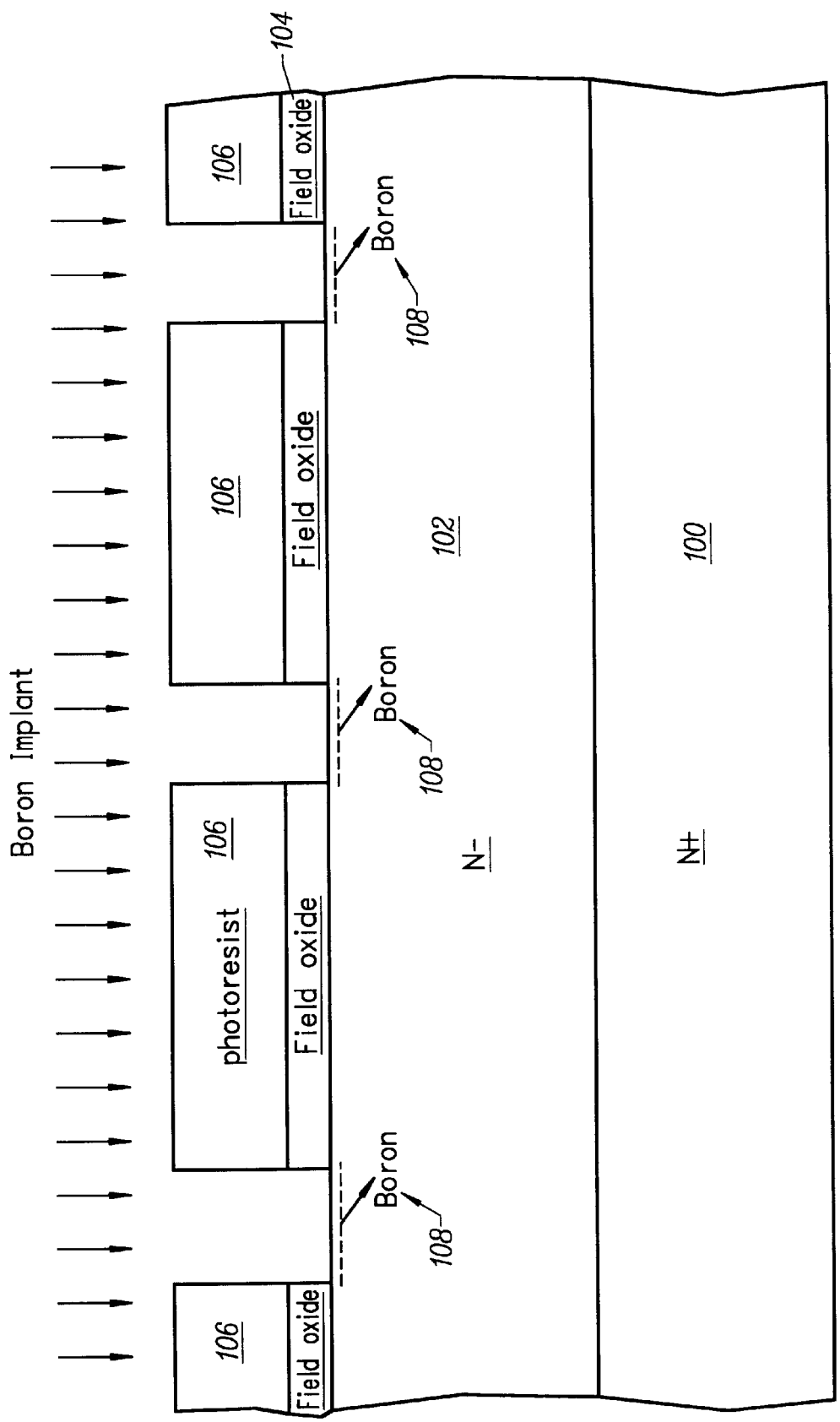
Figure 6:
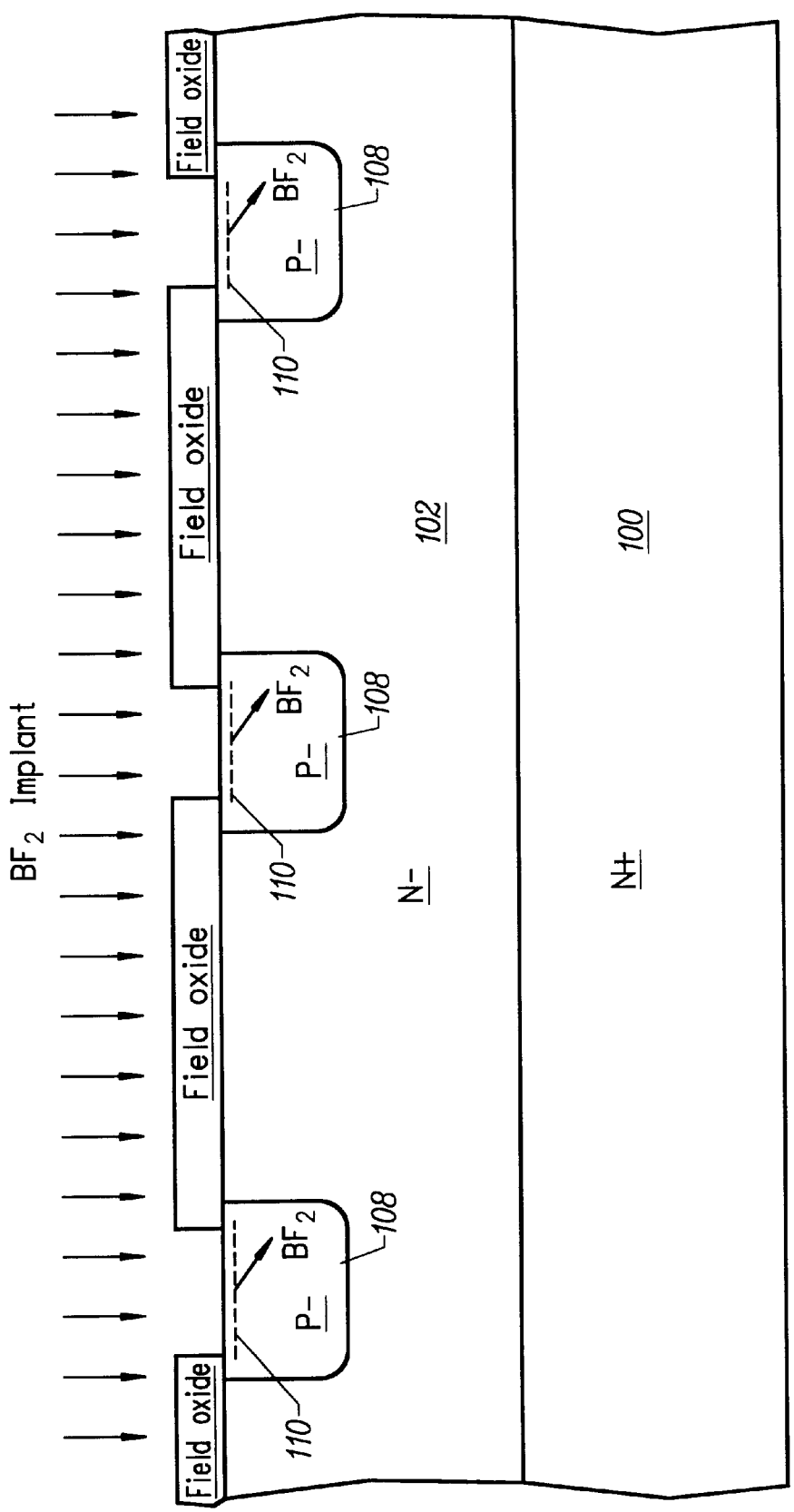

Consider now steps in fabricating a current limiting device in accordance with the invention as illustrated in the section views of FIGS. 4–17. As shown in FIG. 4, the starting material is an N+substrate 100 including an N-epitaxial layer 102 with a field oxide 104 grown or deposited to a thickness of about 300–1,000 microns. In FIG. 5, a photoresist pattern 106 is formed to define the guard ring and plug areas. The exposed field oxide 104 is then etched and boron is implanted at 108. Thereafter, as shown in FIG. 6, the photoresist 106 is removed and boron 108 is driven in to form deep P-regions 108 for the guard ring and plugs. A BF$_2$ implant for high surface concentration is then made to form good ohmic contacts, followed by rapid thermal annealing to activate the BF$_2$ dopant.

Figure 7:
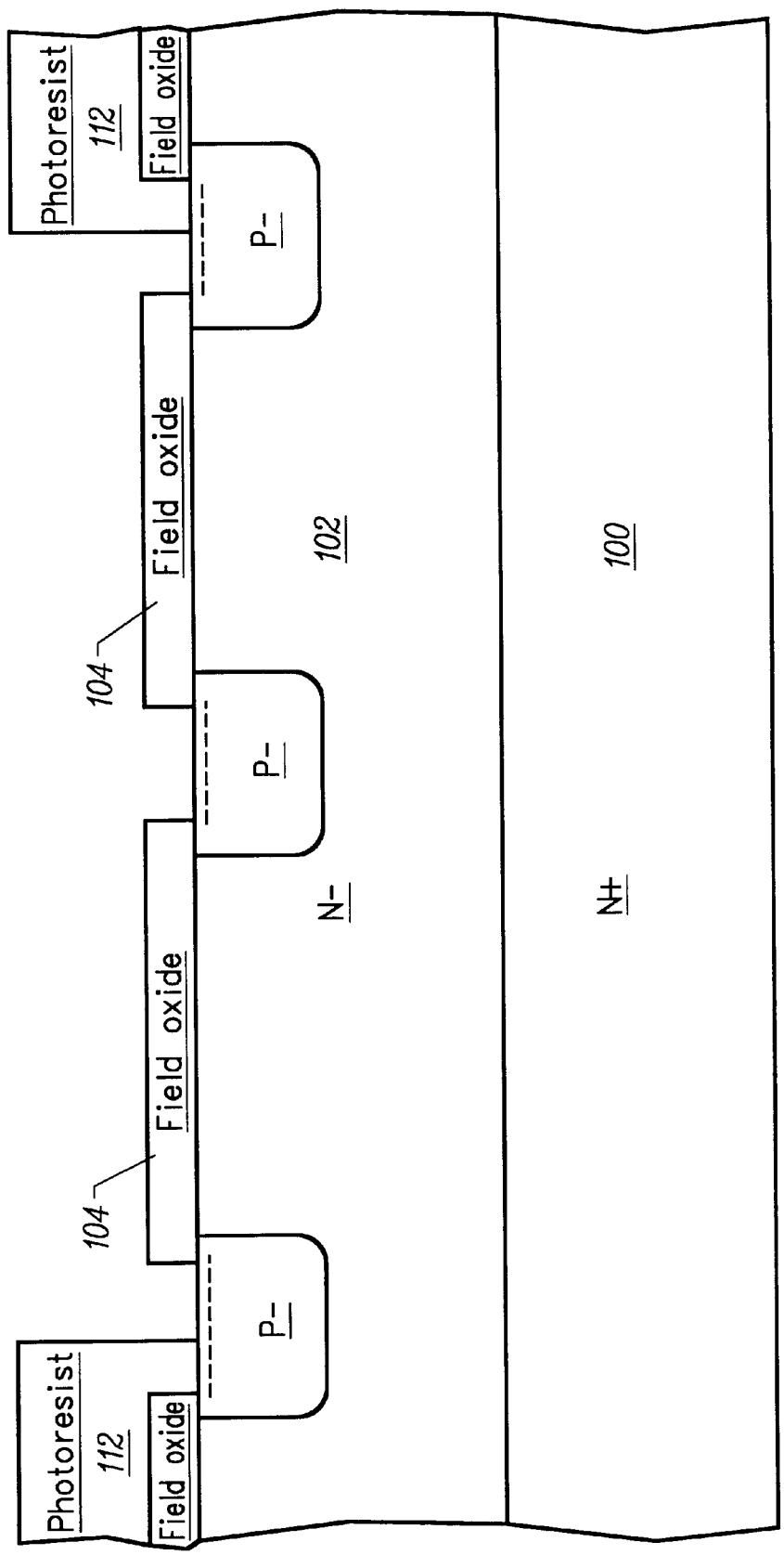
Figure 8:
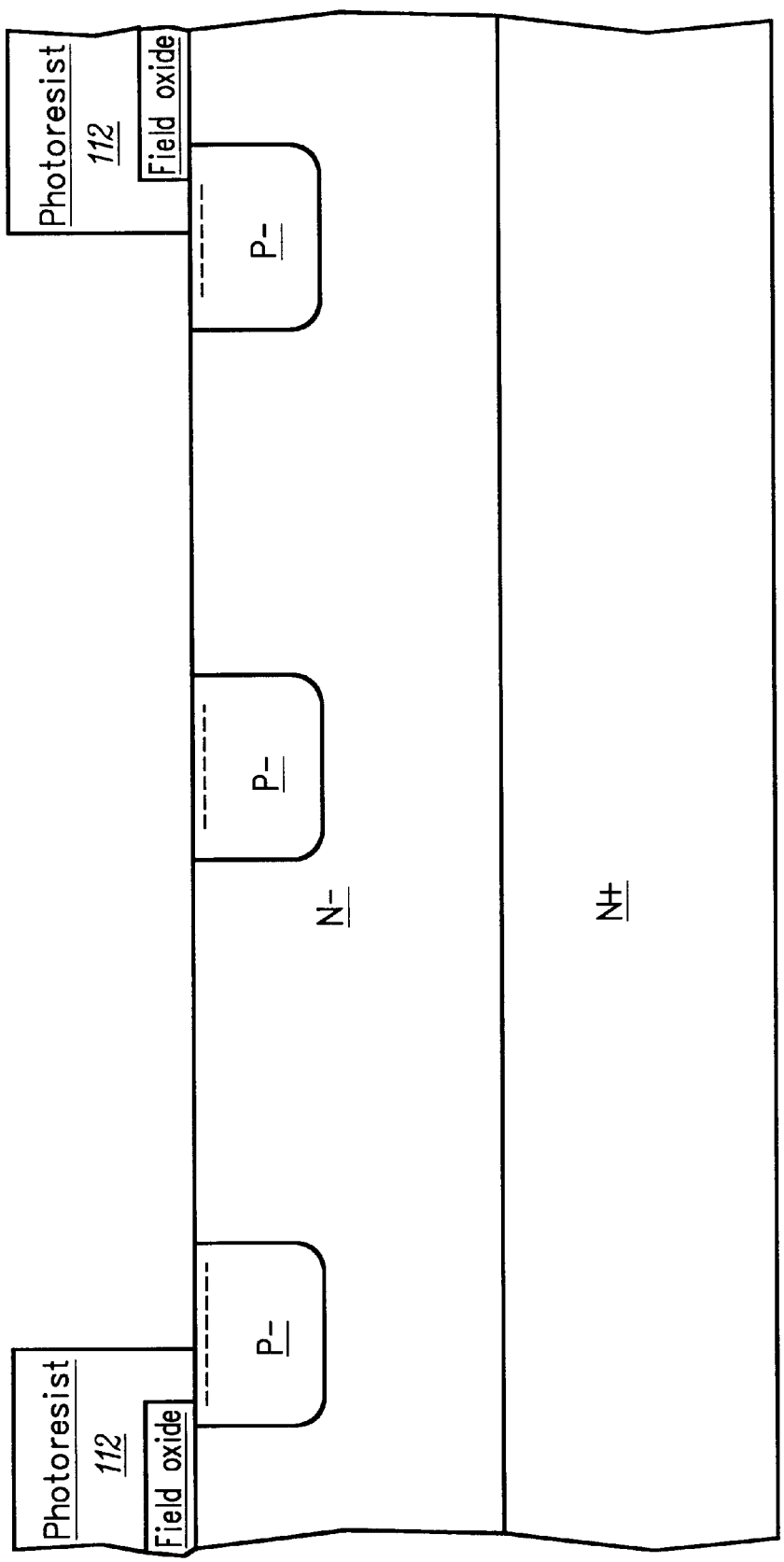
Figure 9:
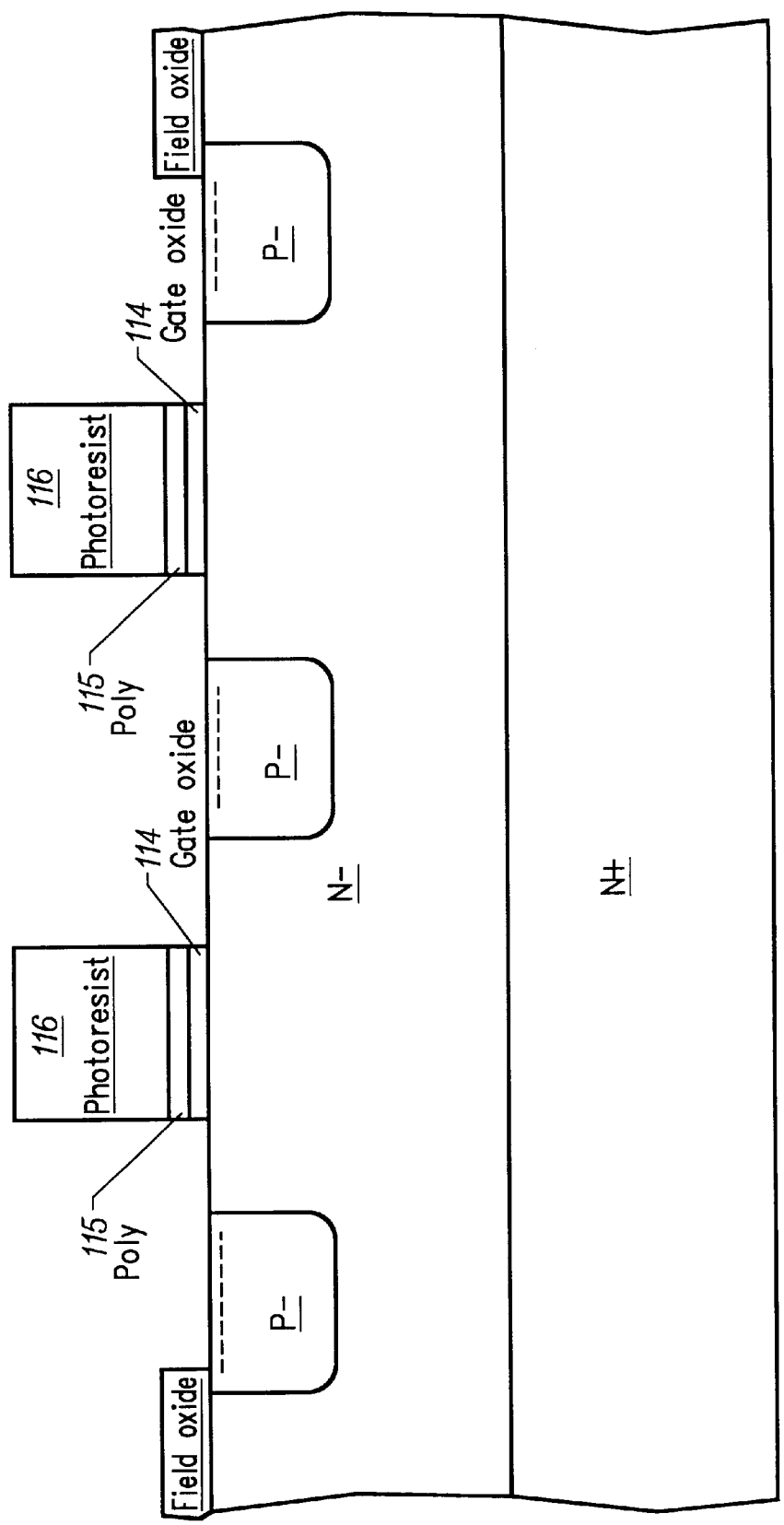

In FIG. 7, a photoresist pattern 112 is formed to expose the active area so that the field oxide 104 can be removed as shown in FIG. 8. Thereafter, as shown in FIG. 9, photoresist 112 is removed and a 3–50 nm gate oxide 114 is grown and thereafter 10–100 nm of in-situ doped polysilicon or undoped polysilicon with implant is deposited. This polysilicon layer is optional if a metal gate MOS cell structure is acceptable. A 0.25–3 micron wide photoresist pattern 116 is then formed to define MOS cell units followed by removal of the exposed polysilicon and gate oxide. The removal of the gate oxide can be delayed until after steps 11A and 11B, infra.

Figure 10:
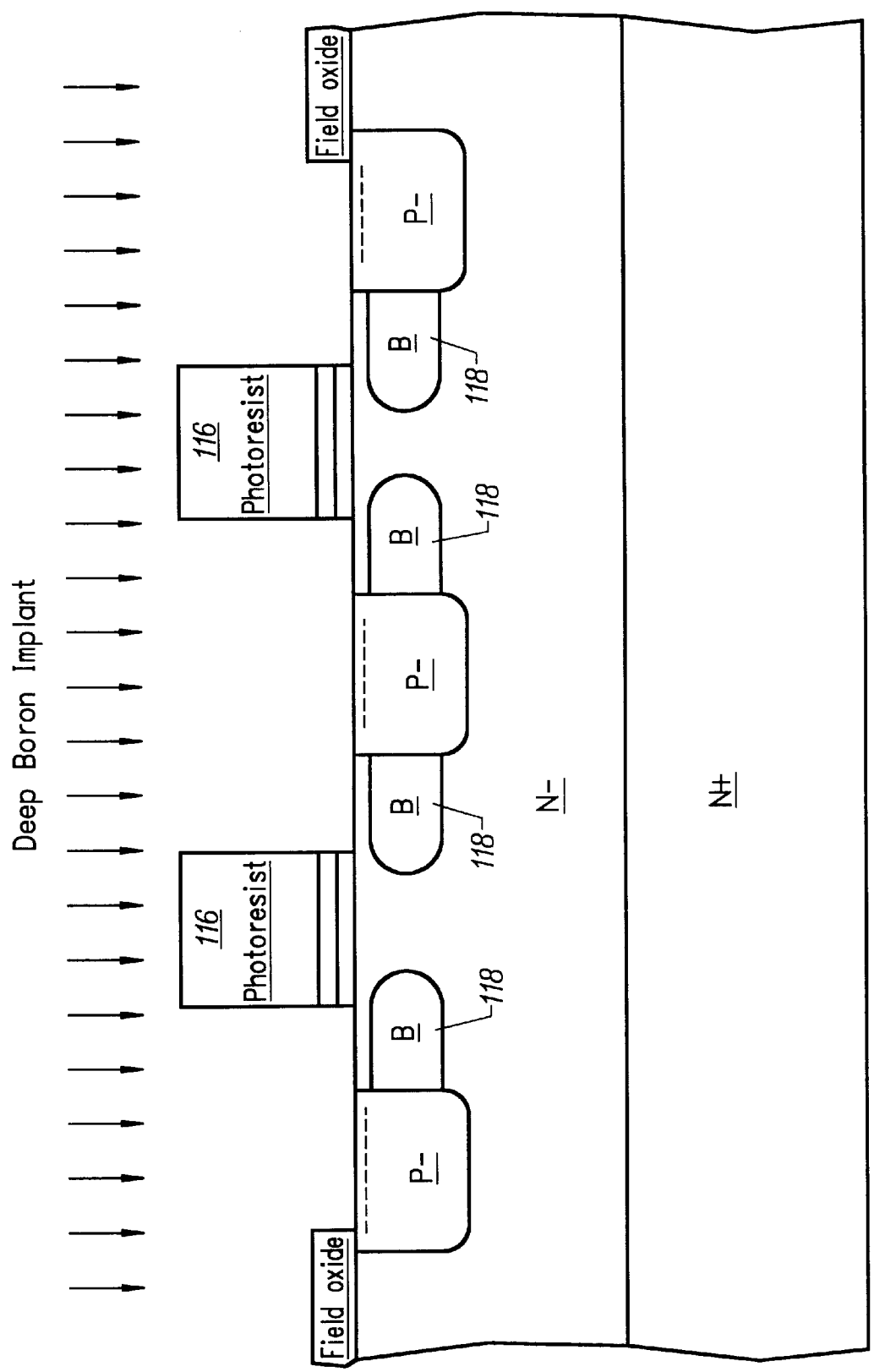
Figure 11A:
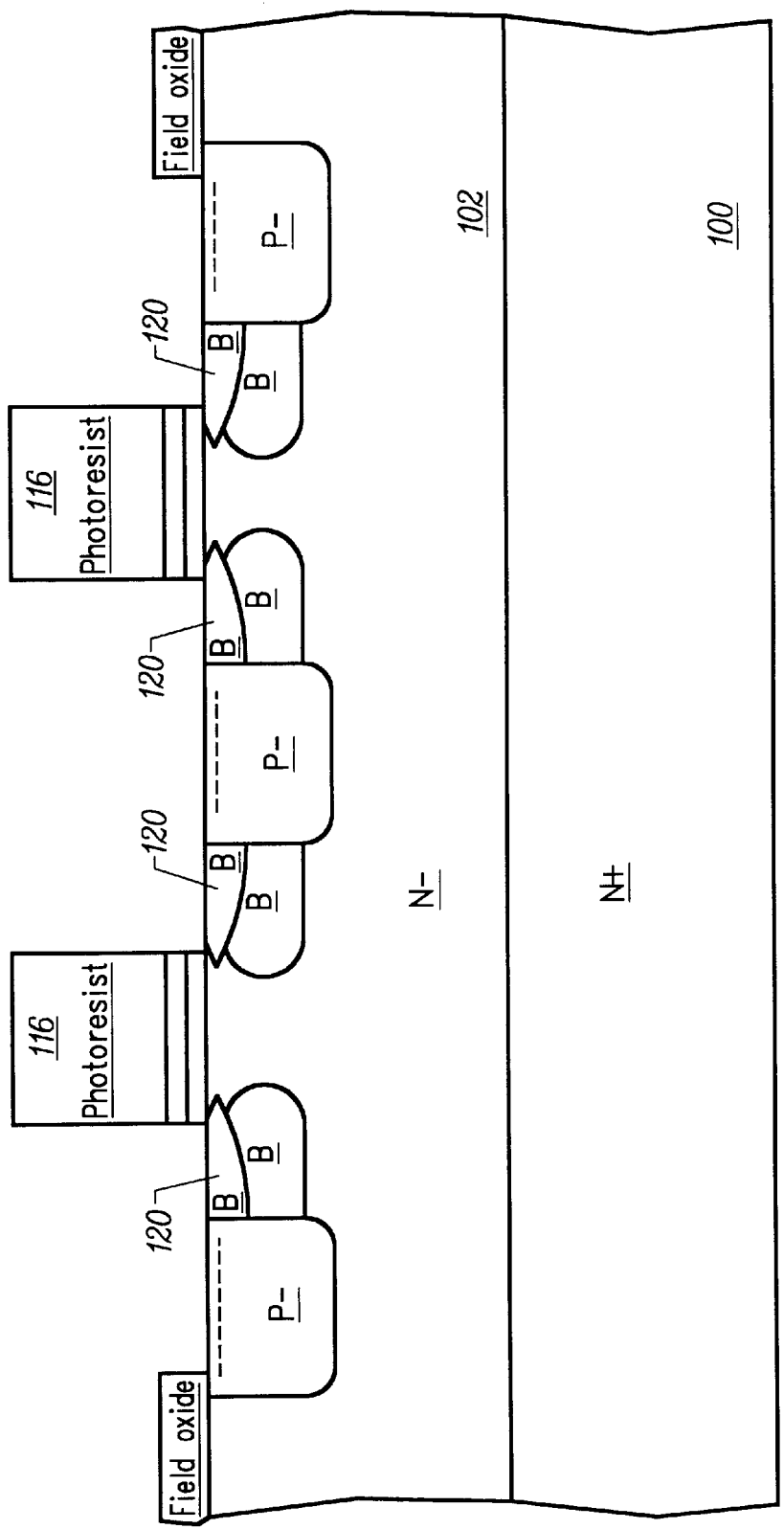

Thereafter, as shown in FIG. 10, a deep boron implant forms regions 118 extending from the guard ring and plugs, which are therefore all electrically connected. The boron implant energy must be high enough to cause some lateral scattering or alternatively the implant can be executed at an angle. Following this step, the steps of FIGS. 11A–12A or alternatively the steps of 11B–12B are carried out. In FIG. 11A, a four-way or continuous rotation angled (0°–50°) shallow boron implant is made to create regions 120, which contact regions 118, and for threshold voltage adjustment. For higher current devices, this implant is not necessary.

In FIG. 12A the exposed gate oxide is etched, if not done so in FIG. 9, and then optional photoresist 121 is formed to cover the guard ring and plug areas. Photoresist 116 can also be removed prior to formation of photoresist 121. An N-type dopant (arsenic) is then implanted in a portion of regions 120 of sufficient concentration to form a good ohmic contact. If photoresist 121 is not formed, the arsenic dose should be about one order of magnitude lower than the BF$_2$ implant dose so that the net surface concentration in the guard ring and the plug area is still P+ with a value that is high enough to form a good P-type ohmic contact.

Figure 11B:
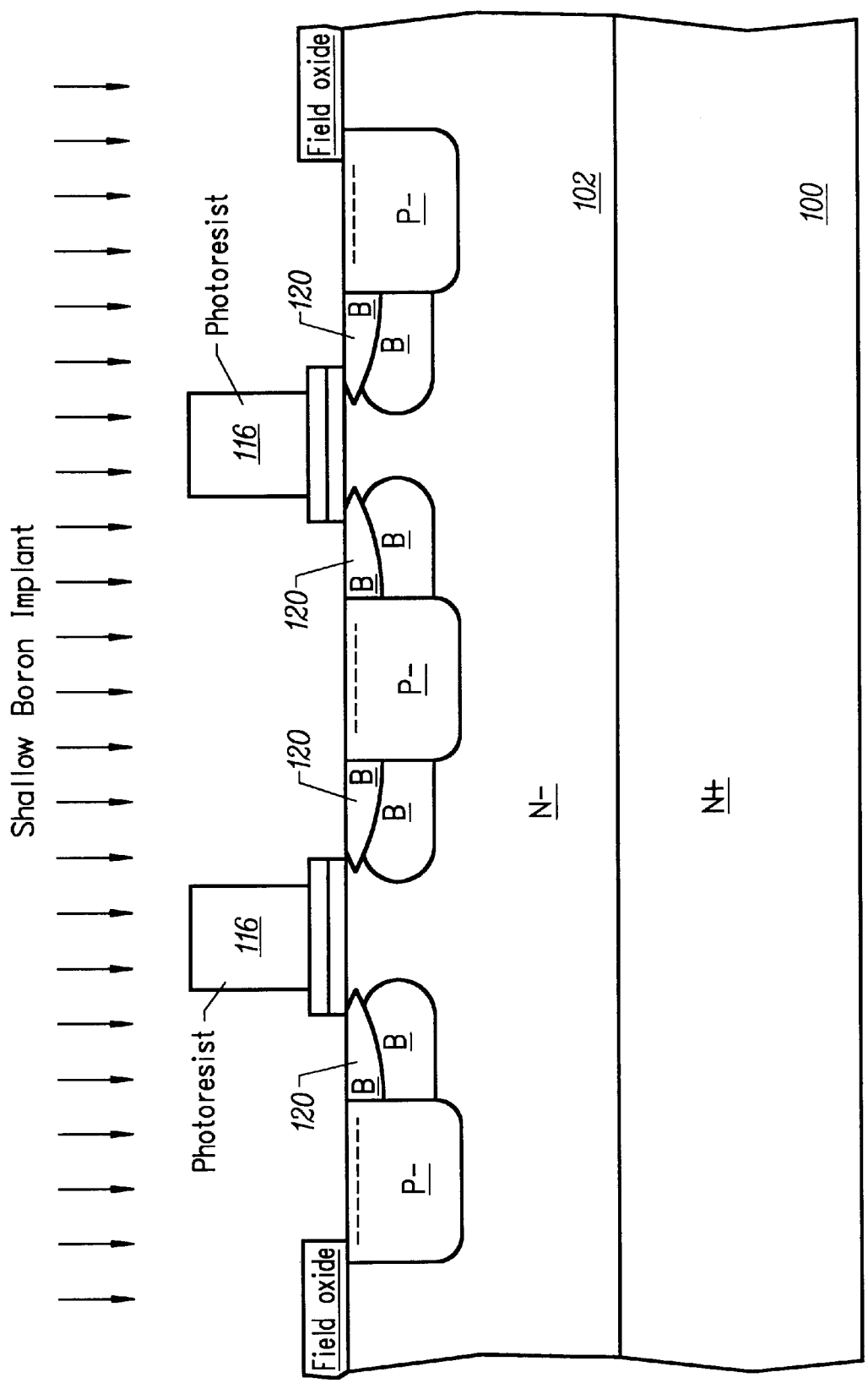
Figure 12B:
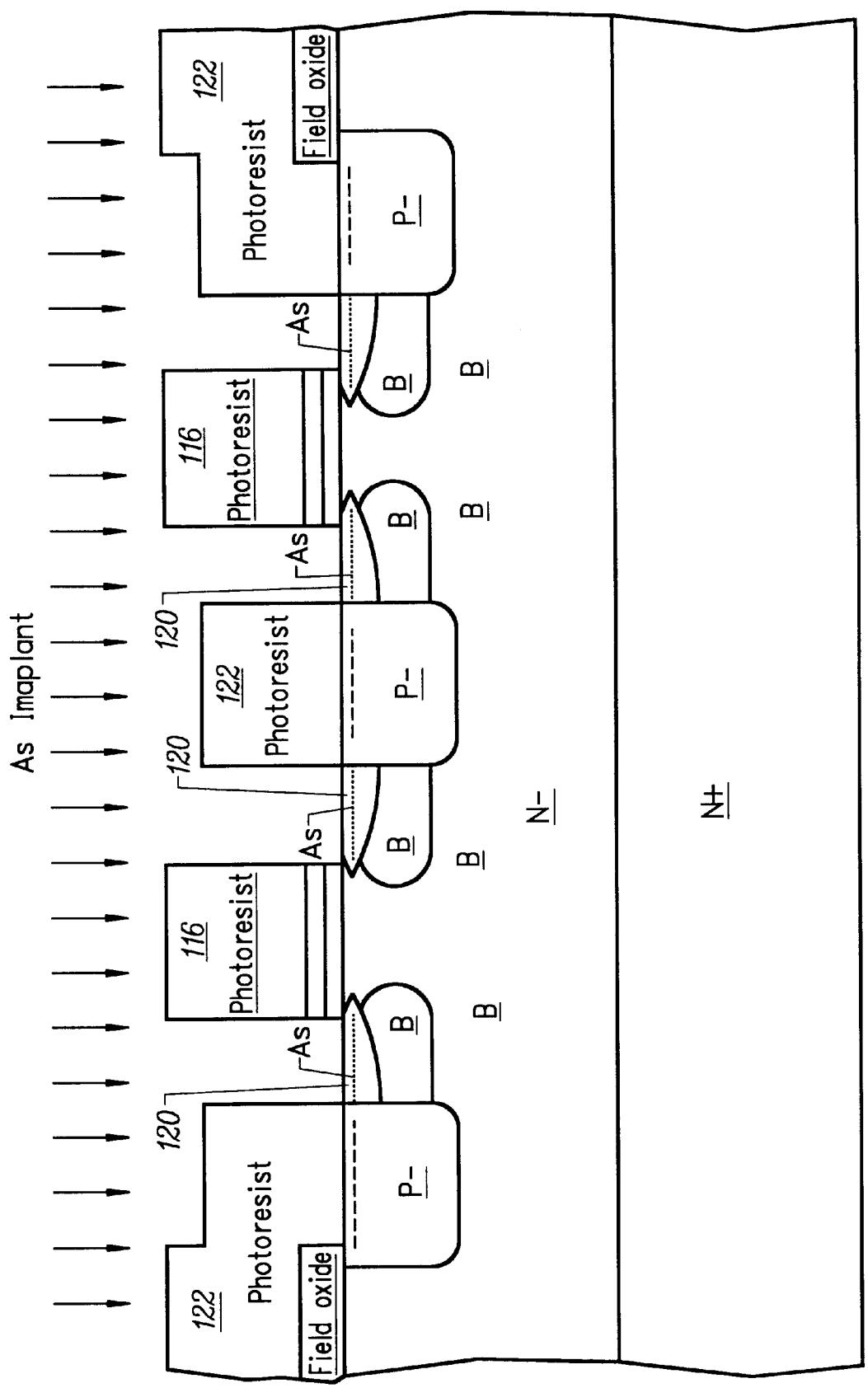

As an alternative to steps 11A and 12A, steps 11B and 12B can be utilized. In FIG. 11B an isotropic O$_2$ plasma etch is applied to remove about 0–300 nm of hotoresist 116, and then shallow boron implants create the regions 120 and for a threshold voltage adjustment. Next, as shown in FIG. 12B, the exposed gate oxide is etched if not done in FIG. 9, and then an optional photoresist 122 is patterned to cover the guard ring and plug areas. Photoresist 116 can be removed also prior to formation of photoresist 122. Arsenic is implanted in a portion of regions 120 with a sufficient dosage to form a good P-type ohmic contact. If photoresist 122 is not formed, again, the arsenic dosage should be about one order of magnitude lower than the BF$_2$ implant dosage so that the net service concentration in the guard and plug area is still P+ with a value that is high enough to form a good P-type ohmic contact.

Figure 13:
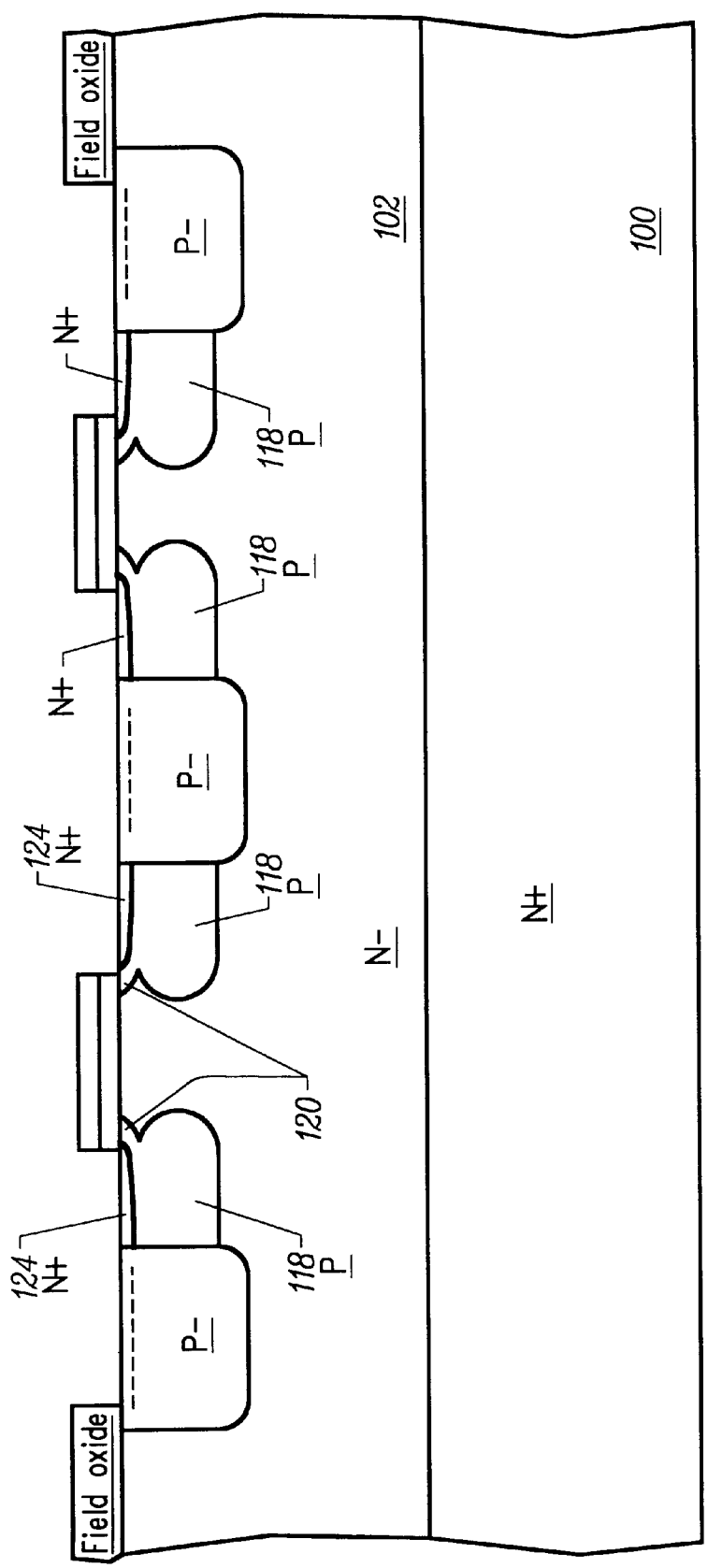

Thereafter, as shown in FIG. 13, the photoresist is removed and rapid thermal annealing is employed to activate all implant, including the N+ regions 124. Alternatively, separate thermal annealing can be applied after each individual implant. The steps of FIGS. 12A and 12B will result in a similar doping profile after activation.

Figure 14:
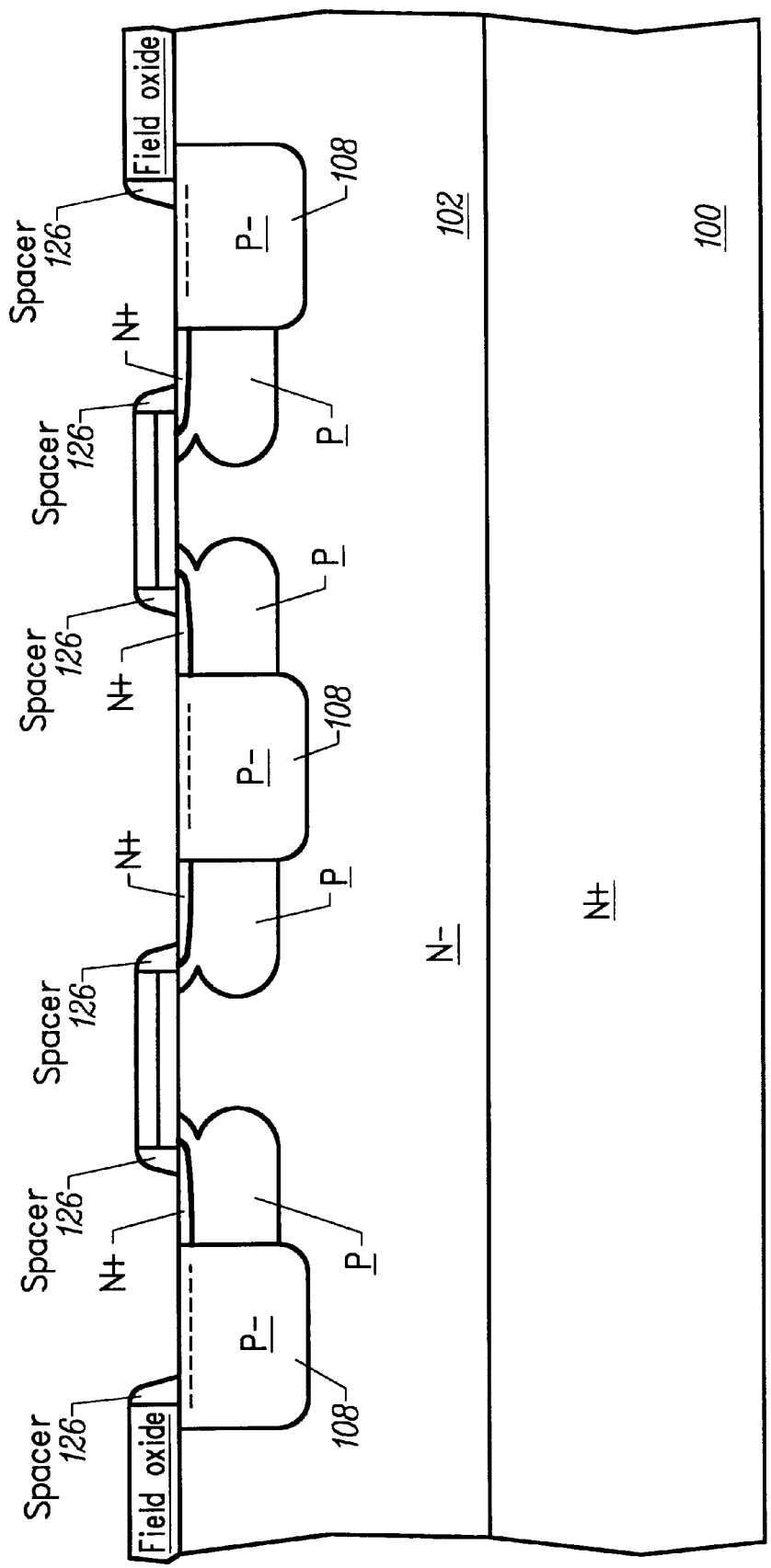
Figure 15:
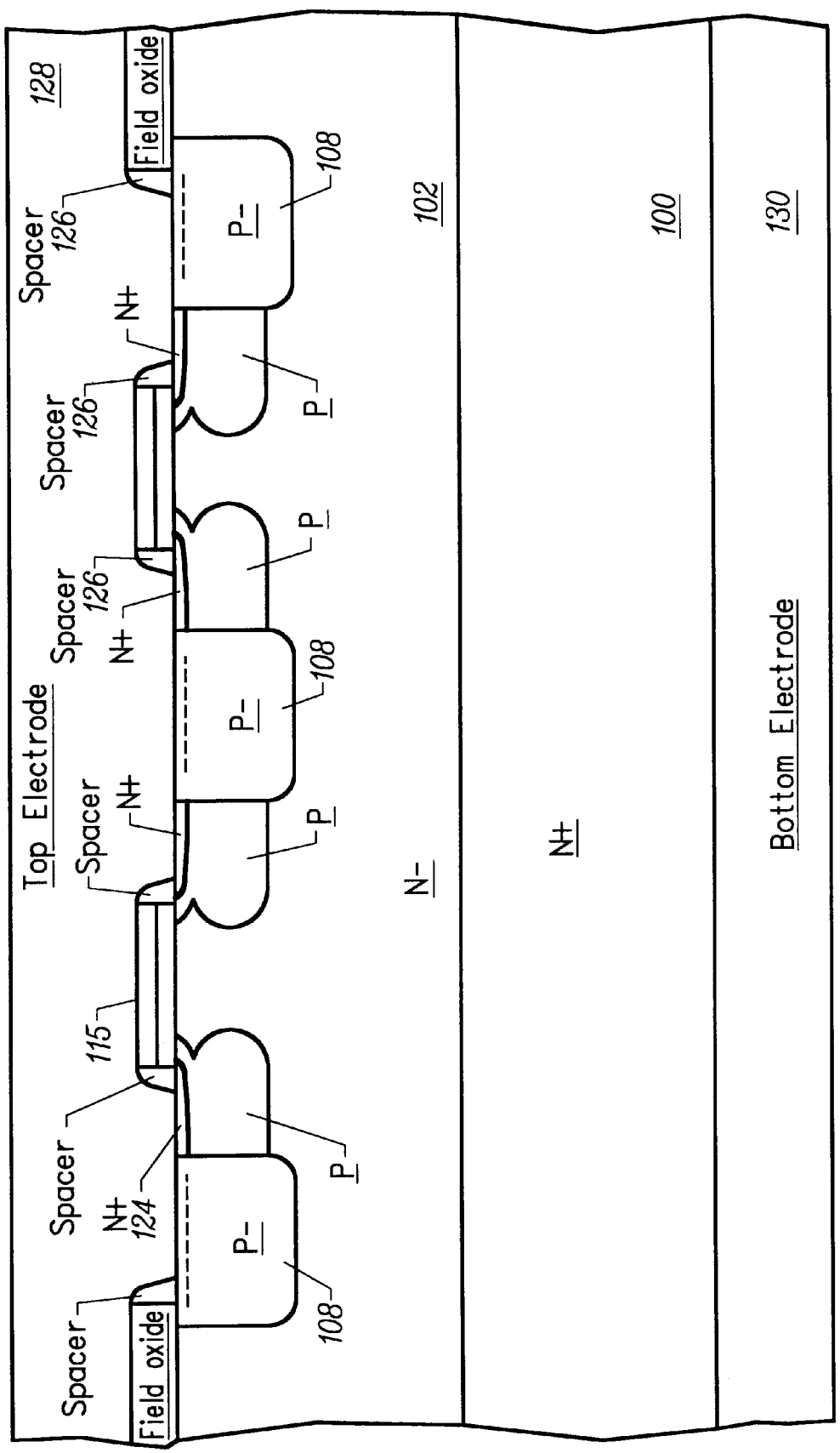

In FIG. 14 a 10–70 nm optional layer of oxide or nitride or polysilicon is deposited and then anisotropically etched to form spacers 126. Thereafter, as shown in FIG. 15, a top electrode 128 is formed in ohmic contact with guard ring and plugs 108, N+ regions 124, and gate 115. Similarly, a bottom electrode 130 is formed on the surface of substrate 100. The materials for the top and bottom electrodes can be a refractory metal such as Ti, W, Ni, or other ohmic materials such Ag, Au, Cu, and Al, for example, or combinations of two or more materials.

Figure 16:
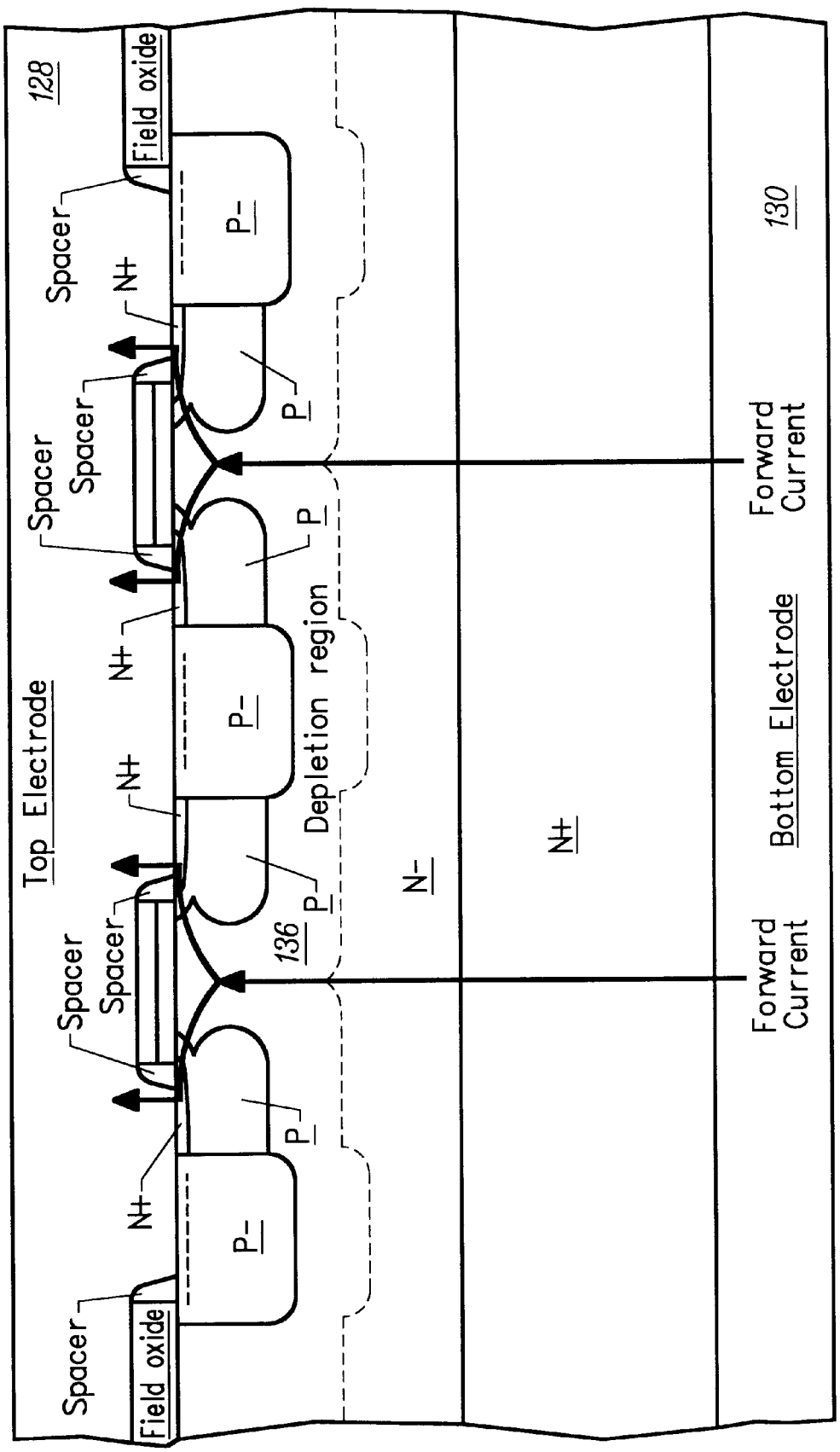
Figure 17:
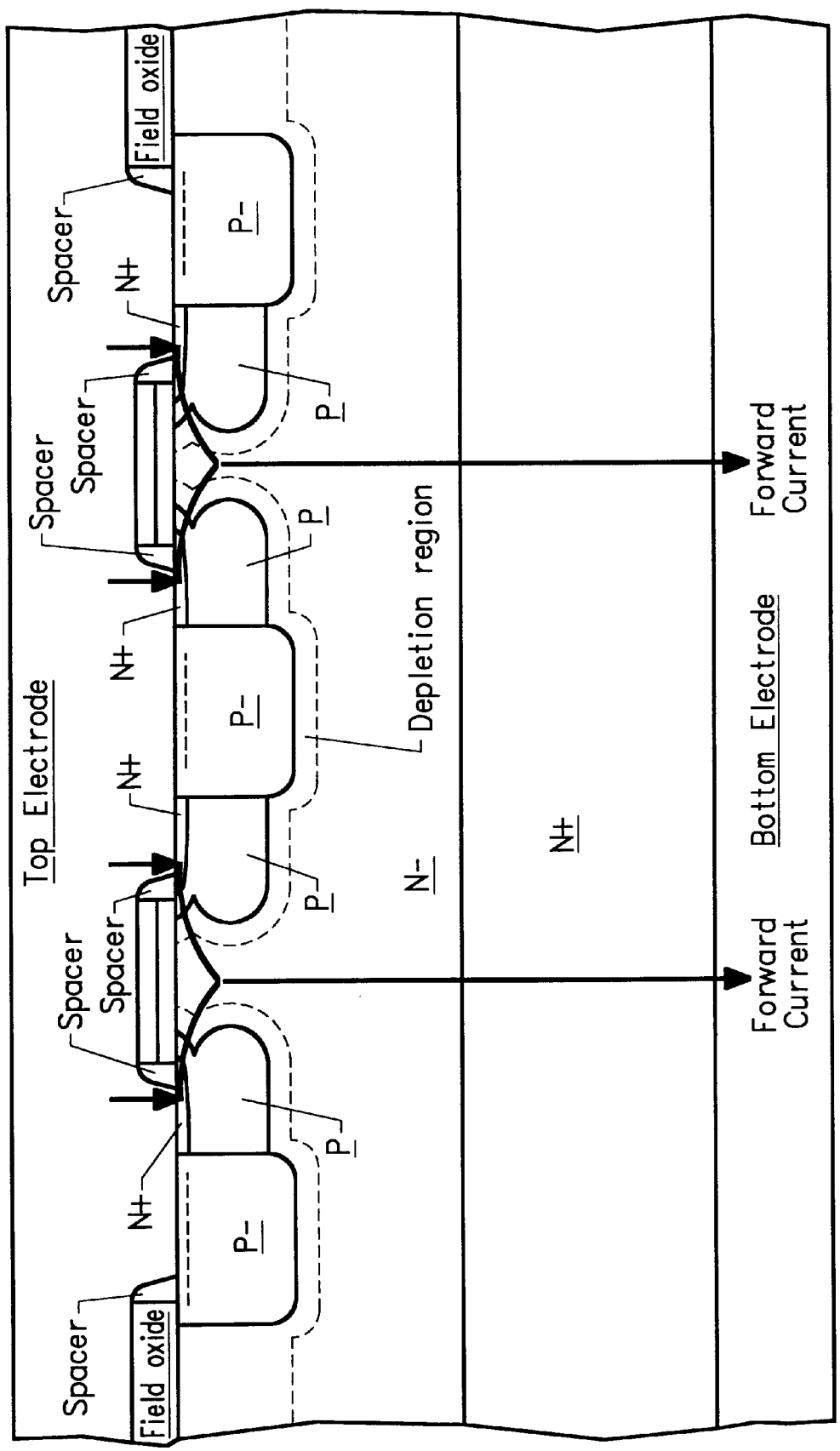
Figure 19:
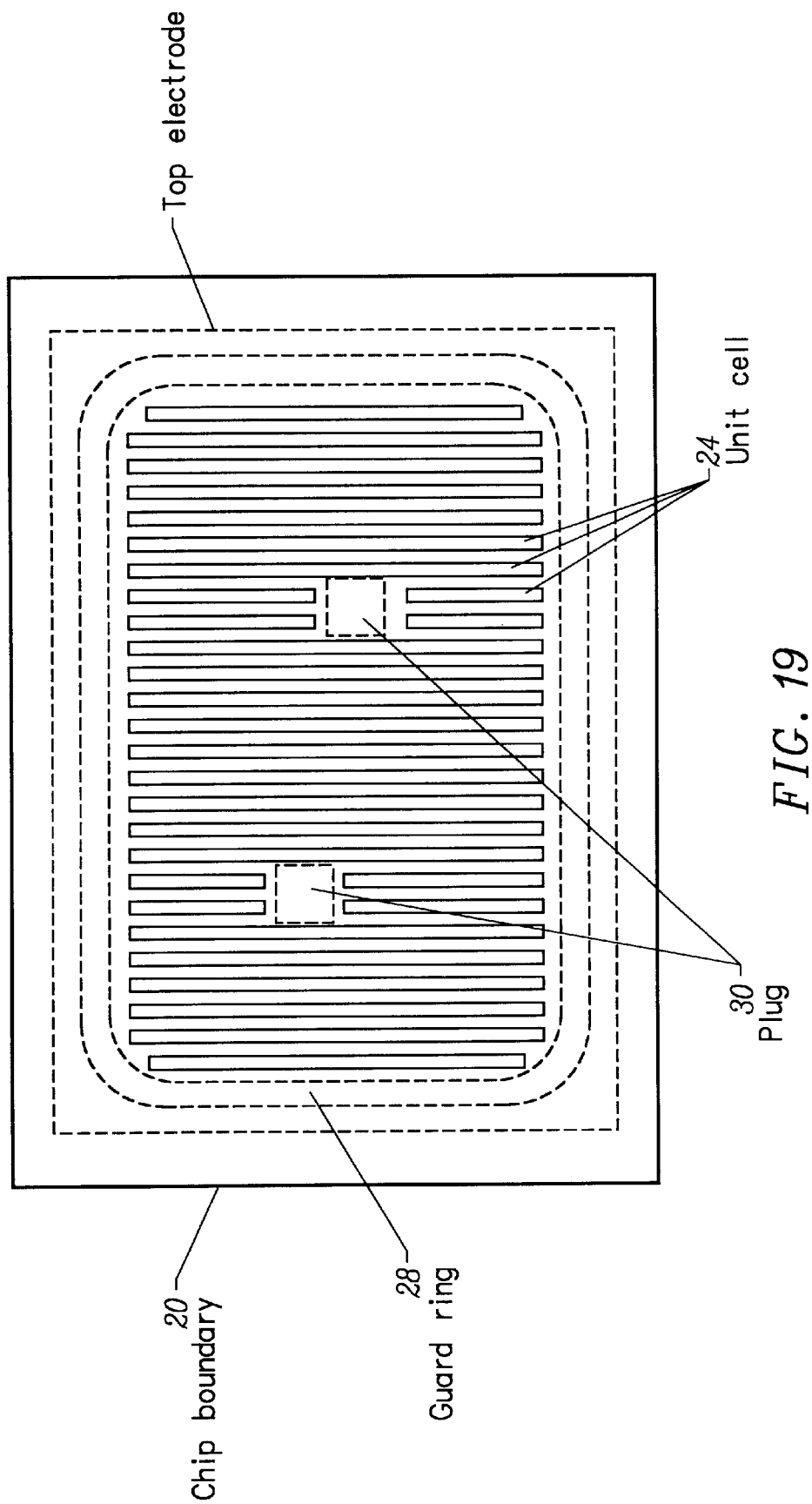
Figure 20:
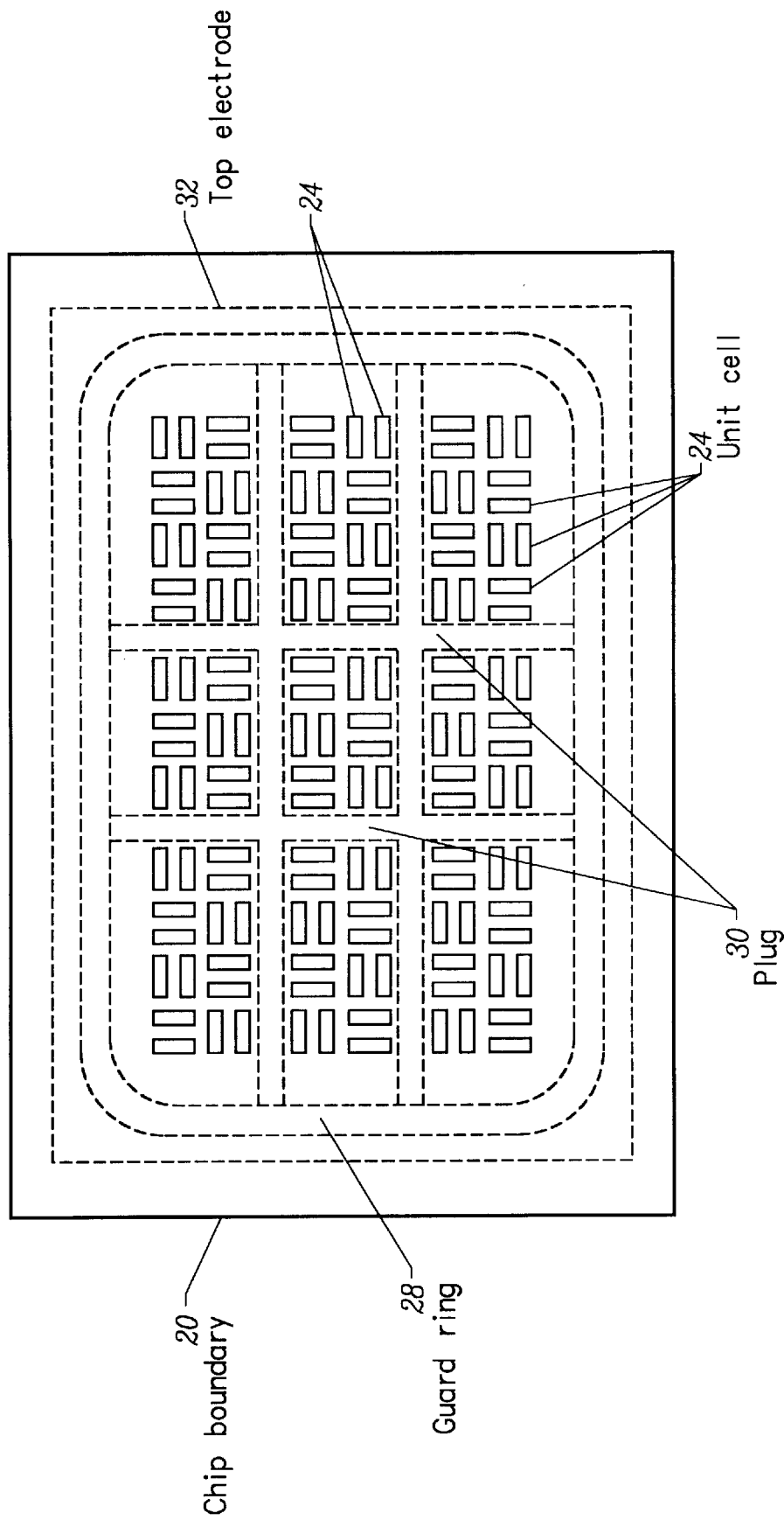
Figure 21:
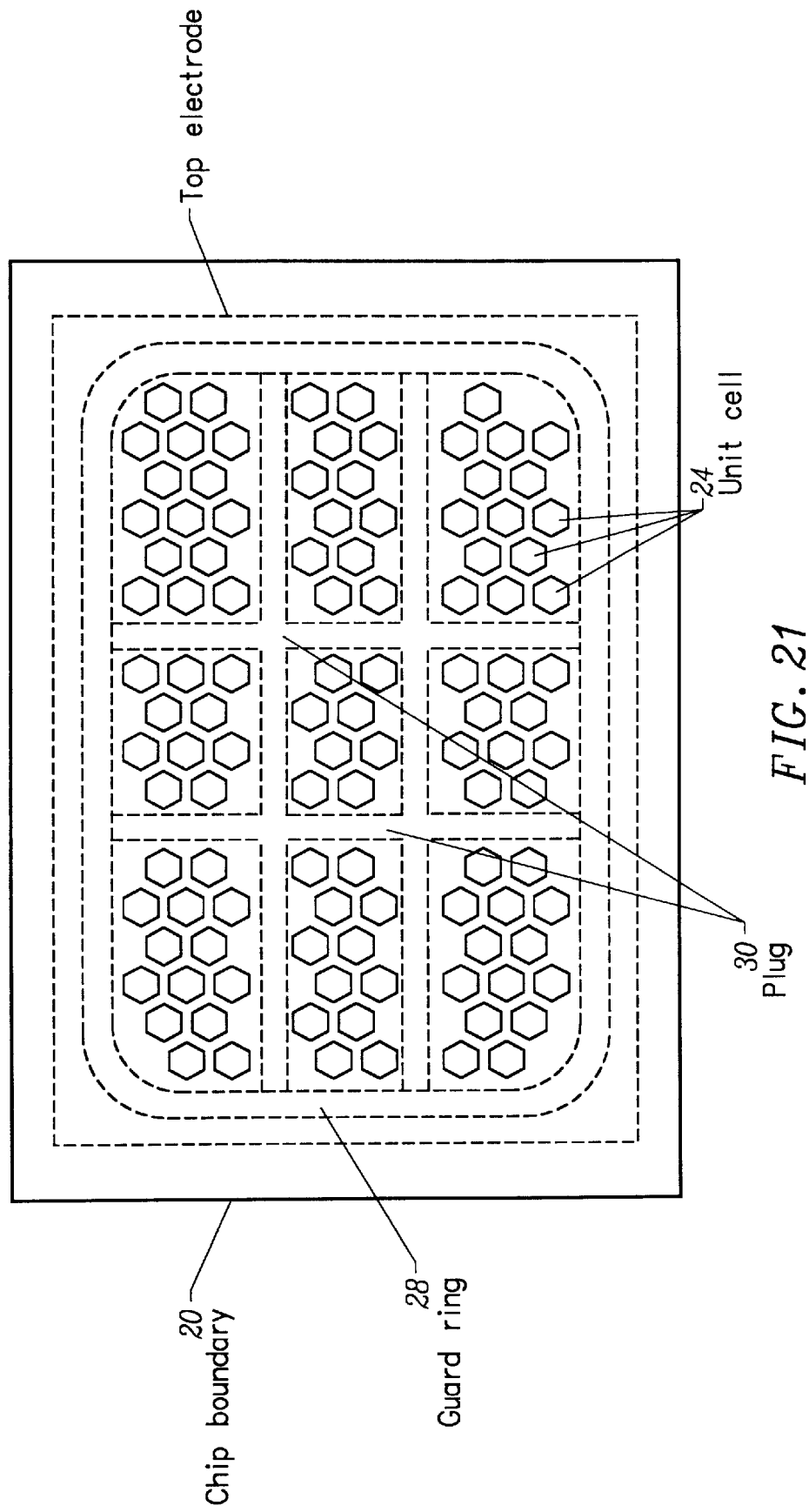
Figure 22:
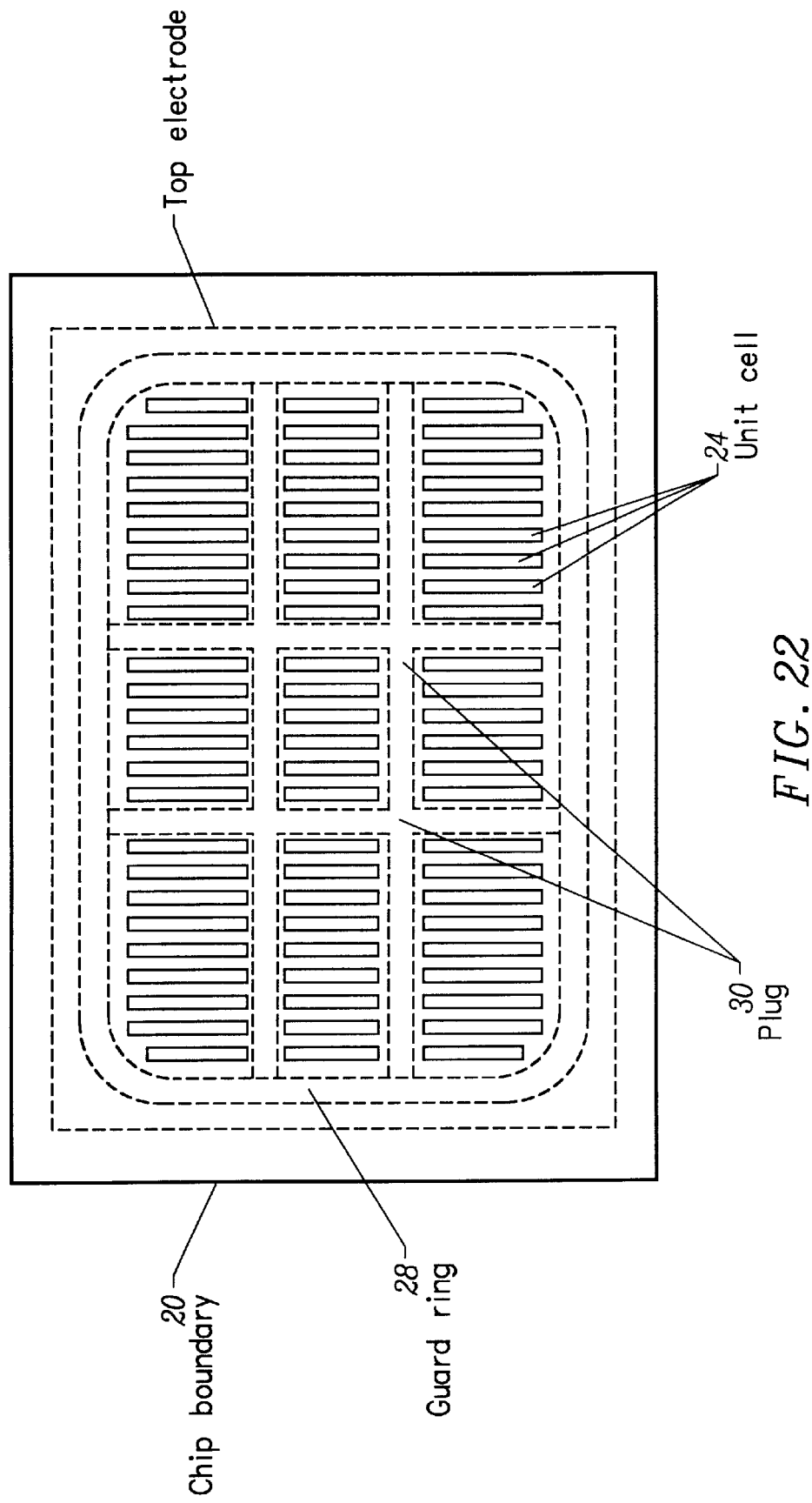
Figure 23:
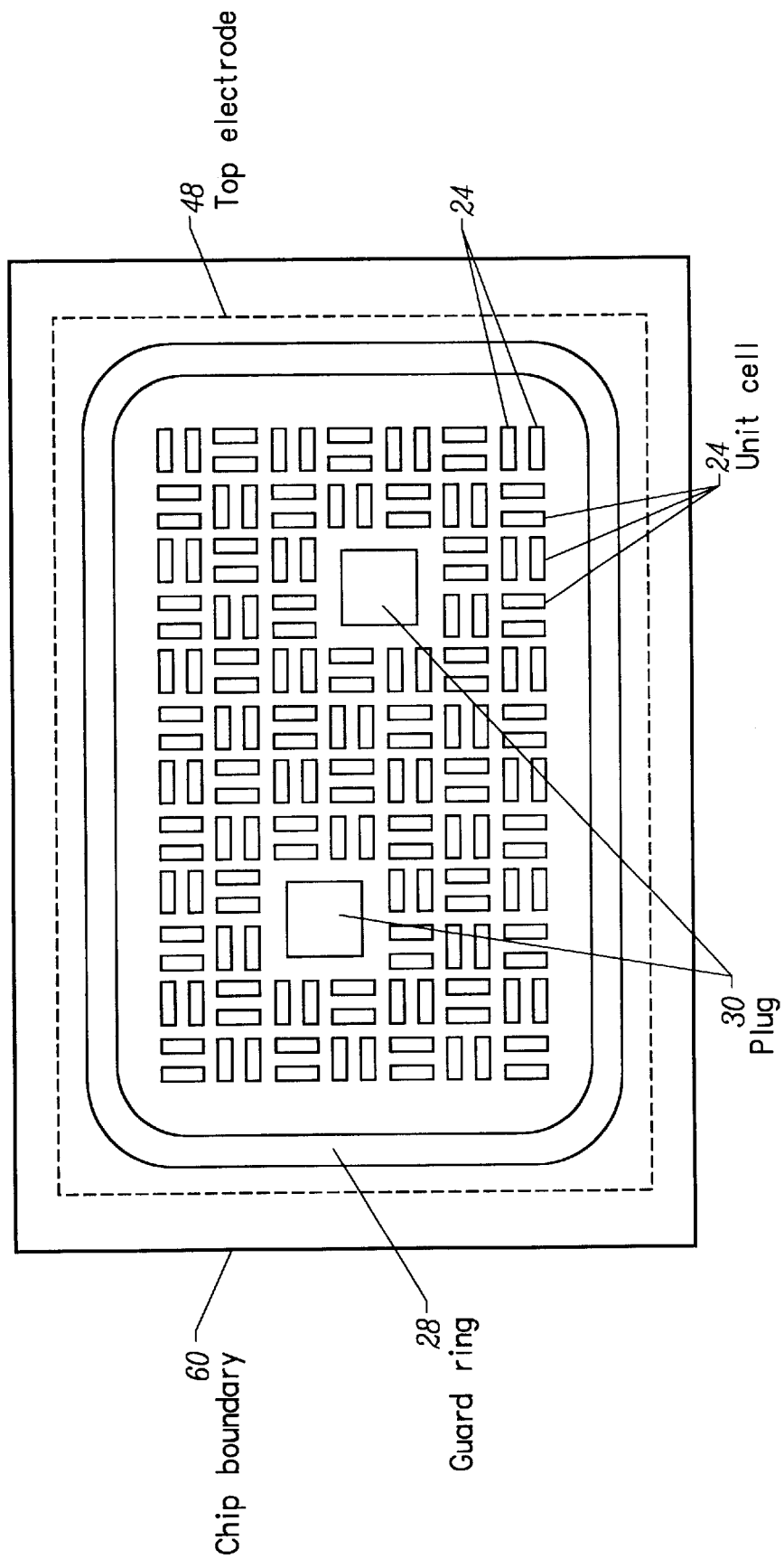

FIGS. 16 and 17 illustrate current flow through the device with a forward bias and with a reverse bias, respectively. In FIG. 19, the forward bias increases the depletion 130 to pinch-off, thus limiting current flow, and limiting the $\Delta I_{lim}$, and increasing $V_{br}$. The forward bias illustrated in FIG. 17 limits the current.

Figure 18:
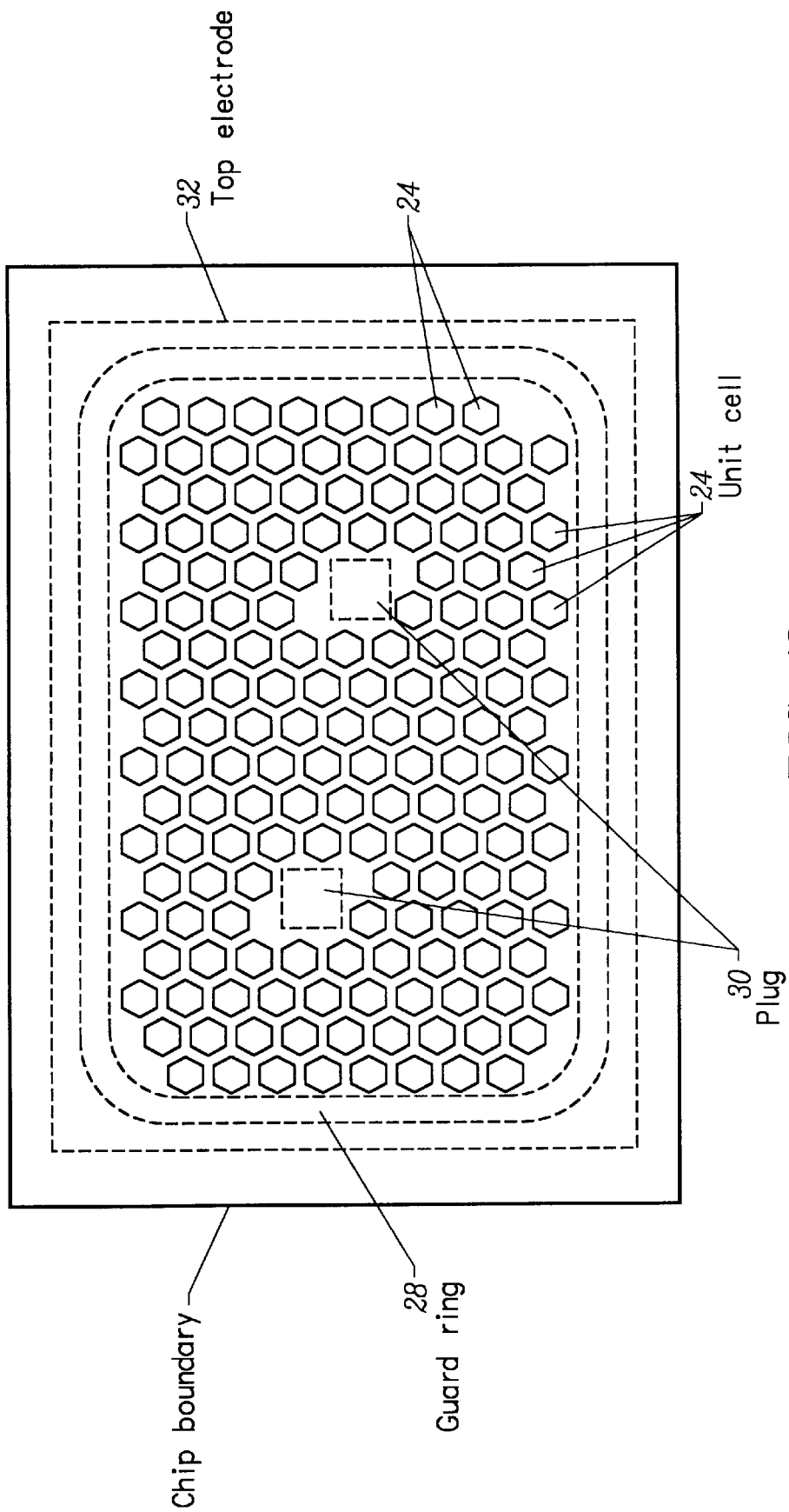
FIGS. 18–23 are top views illustrating alternative configurations of the cells and plugs in a device in accordance with the invention.

FIGS. 18–23 are top views of the finished device showing alternative arrangements. In FIG. 18 the unit cells 24 are hexagonal, in FIGS. 19 and 22 the unit cells are stripes, and in FIGS. 20–22, the plugs 30 comprise a grid between groupings of unit cells 24.

The boron doping profile to provide a higher dopant concentration within the device body and spaced from the overlying P-doped channel region enhances device current-voltage characteristics by facilitating pinch-of of the current path.

While the invention has been described with reference to specific embodiments, the description is illustrative of the invention and is not to be construed as limiting the invention. Various modifications and applications may occur to those skilled in the art without departing from the true and scope of the invention as defined by the appended claims.

What is claimed is:

1. A semiconductor current limiting device comprising:
   a) a semiconductor substrate of one conductivity type,
   b) at least one gate electrode overlying a gate insulator on a first surface of the substrate,
   c) a channel region of a second conductivity type in the first surface of the substrate underlying a first peripheral region of the gate electrode,
   d) a first doped region of the second conductivity type contiguous with the channel region, and underlying the first peripheral region of the gate electrode, and positioned deeper in the substrate than the channel region extending further and under a second peripheral region of the gate electrode,
   e) a second doped region of the first conductivity type in the first surface of the substrate and within an extension of the channel region and adjacent to the gate electrode,
   f) a first electrode on the first surface in ohmic contact with the second doped region and the gate electrode, and
   g) a second electrode on a second surface of the substrate opposite from the first surface,
   whereby the first doped region tends to pinch off a conduction channel from the second electrode through the substrate to other first electrode when a forward bias is applied between the second electrode and the first electrode.

2. The device as defined by claim 1 wherein the substrate includes an epitaxial layer of the one conductivity type which provides the first surface of the substrate, the epitaxial layer being lighter doped than the underlying substrate.

3. The device as defined by claim 2 and further including a doped guard ring of the second conductivity type which surrounds the gate electrode, the first electrode ohmically contacting the doped guard ring.

4. The device as defined by claim 3 and further including at least one doped plug of the second conductivity type in the epitaxial layer, the first electrode ohmically contacting the doped plug.

5. The device as defined by claim 4 wherein the first conductivity type is N-type and second conductivity type is P-type.

6. The device as defined by claim 5 wherein the first electrode and the second electrode comprise a metal selected from the group consisting of Ti, W, Ni, Ag, Cu, Al, and a combination of at least two materials of the group.

7. The device as defined by claim 6 and further including a plurality of gate electrodes, channel regions, first doped regions, and second doped regions all within the guard ring.

8. The device as defined by claim 7 wherein each gate electrode is rectangular in configuration.

9. The device as defined by claim 7 wherein each gate electrode is square in configuration.

10. The device as defined by claim 7 wherein each gate electrode is hexagonal in configuration.

11. The device as defined by claim 7 wherein each gate electrode is circular in configuration.

12. The device as defined by claim 7 wherein the plug comprises a grid between groups of gate electrodes.

13. The device as defined by claim 3 and further including a plurality of gate electrodes, channel electrodes, first doped regions, and second doped regions all within the guard ring.

14. The device as defined by claim 13 and further including at one doped plug of the second conductivity type in the epitaxial layer, the first electrode ohmically contacting the doped plug.

15. The device as defined by claim 1 wherein the first peripheral region and the second peripheral region are in alignment.

16. The device as defined by claim 1 wherein the second peripheral region extends farther under the gate than the first peripheral region.

17. The device as defined by claim 1 wherein the gate insulator comprises silicon oxide.

* * * * *